(12) United States Patent
Bouchaïb et al.

(10) Patent No.: US 7,021,238 B2
(45) Date of Patent: Apr. 4, 2006

(54) MOLECULAR BEAM EPITAXY EQUIPMENT

(75) Inventors: Pierre Bouchaïb, Carrières-sur-Seine (FR); Franck Stemmelen, Jouy-le-Moutier (FR)

(73) Assignee: Addon, (FR)

(*) Notice: Subject to any disclaimer, the term of this patent is extended or adjusted under 35 U.S.C. 154(b) by 9 days.

(21) Appl. No.: 10/722,985

(22) Filed: Nov. 26, 2003

(65) Prior Publication Data
US 2004/0129216 A1 Jul. 8, 2004

Related U.S. Application Data

(63) Continuation of application No. PCT/FR02/01806, filed on May 29, 2002.

(30) Foreign Application Priority Data
May 20, 2001 (FR) ................................. 01/06997

(51) Int. Cl.
C23C 14/54 (2006.01)
C23C 14/24 (2006.01)

(52) U.S. Cl. ................... 118/723 VE; 118/723 CB; 118/726

(58) Field of Classification Search ......... 118/723 VE, 118/723 CB, 723 EB, 726, 727
See application file for complete search history.

(56) References Cited

U.S. PATENT DOCUMENTS

| 4,424,104 | A | | 1/1984 | Harper et al. | |
|---|---|---|---|---|---|
| 4,856,457 | A | * | 8/1989 | Knauer | 118/666 |
| 5,026,454 | A | * | 6/1991 | Parmenter et al. | 117/105 |
| 5,188,671 | A | * | 2/1993 | Zinck et al. | 118/715 |
| 5,714,008 | A | | 2/1998 | Lee et al. | |
| 5,906,857 | A | * | 5/1999 | McKee et al. | 427/8 |
| 5,976,263 | A | * | 11/1999 | Poole | 118/726 |
| 6,011,904 | A | * | 1/2000 | Mattord | 392/389 |
| 6,342,265 | B1 | * | 1/2002 | Kelson et al. | 427/9 |
| 6,617,574 | B1 | * | 9/2003 | Kelson et al. | 250/252.1 |
| 2002/0050160 | A1 | * | 5/2002 | Kelson et al. | 73/1.01 |
| 2004/0129216 | A1 | * | 7/2004 | Bouchaib et al. | 118/715 |

FOREIGN PATENT DOCUMENTS

| EP | 0 692 556 A1 | 1/1996 |
|---|---|---|
| JP | 09 118590 A | 5/1997 |
| WO | WO 97/06292 | 2/1997 |

OTHER PUBLICATIONS

Random House Webster's Unabridged Dictionary, definition of "dihedron" p. 554, 2001.*

* cited by examiner

Primary Examiner—Jeffrie R. Lund
(74) Attorney, Agent, or Firm—DLA Piper Rudnick Gray Cary US LLP

(57) ABSTRACT

Epitaxy equipment including an epitaxy chamber under vacuum containing a substrate support and at least one cell under vacuum for evaporation of epitaxy material closed by a diaphragm having at least one opening and communicating with the epitaxy chamber by a connecting flange, and a mobile plate positioned opposite the diaphragm such that the distance of the plate from an exterior surface of the diaphragm is variable and has a section corresponding to a section of the diaphragm and a molecular beam is formed at the level of a zone surrounding the plate.

9 Claims, 7 Drawing Sheets

MOLECULAR BEAM EPITAXY EQUIPMENT

RELATED APPLICATION

This is a continuation of International Application No. PCT/FR02/01806, with an international filing date of May 29, 2002 (WO 02/097172, published Dec. 5, 2002), which is based on French Patent Application No. 01/06997, filed May 29, 2002.

FIELD OF THE INVENTION

This invention pertains to the field of molecular beam epitaxy equipment.

BACKGROUND

Molecular beam epitaxy consists of propelling atoms or molecules to the surface of a substrate in a very strong vacuum to avoid any interaction on the course of travel and minimize the contamination that stems from the residual gases of the vacuum. The molecules are produced by heating and evaporation under vacuum (circa $10^{-10}$ Torr) in a cell communicating with the epitaxy chamber. The materials used in epitaxy can be of a different nature and exist in solid, liquid or gaseous form. They are the constitutive elements of the semiconductor alloys called "compounds" (semiconductor compounds), i.e., formed by a minimum of two simple chemical elements, for example, gallium and nitrogen for GaN or gallium nitride, gallium, nitrogen and arsenic for GaAsN. There can be present materials for doping semiconductor compounds, e.g., silicon and beryllium for n or p doping of GaAs. There is described in the state of the art in U.S. Pat. No. 4,424,104 epitaxy equipment comprising an evaporation source closed by a grill.

SUMMARY OF THE INVENTION

This invention relates to epitaxy equipment including an epitaxy chamber under vacuum containing a substrate support and at least one cell under vacuum for evaporation of epitaxy material closed by a diaphragm having at least one opening and communicating with the epitaxy chamber by a connecting flange, and a mobile plate positioned opposite the diaphragm such that the distance of the plate from an exterior surface of the diaphragm is variable and has a cross section corresponding to a cross section of the diaphragm and a molecular beam is formed at the level of a zone surrounding the plate.

BRIEF DESCRIPTION OF THE DRAWINGS

Better comprehension of the invention will be obtained from the description below of a nonlimitative example of implementation making reference to the attached drawings in which.

DETAILED DESCRIPTION

Figure 1:
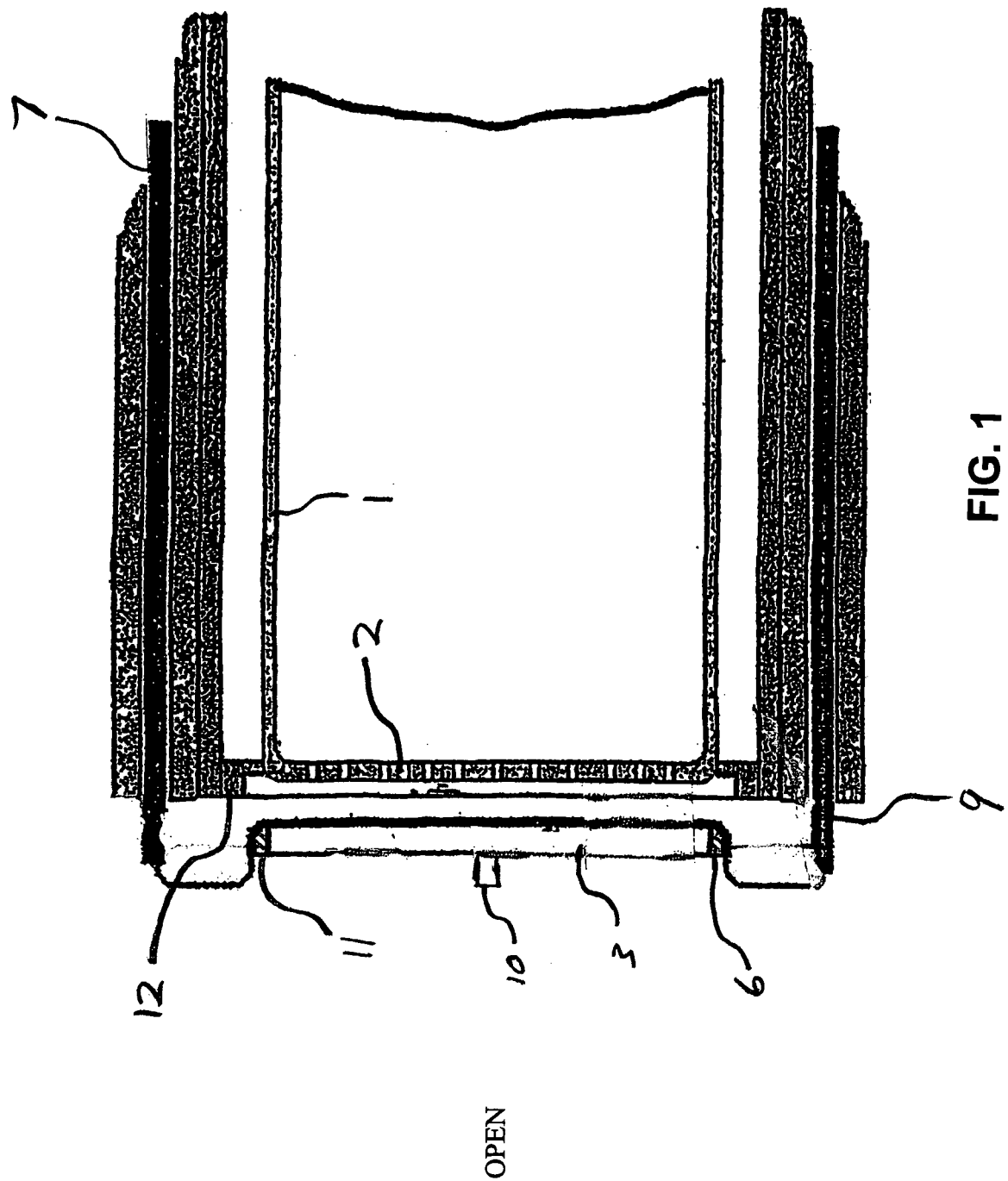
FIG. 1 represents a longitudinal sectional view of the evaporation cell in the open position.

The invention pertains to the creation of semiconductor compounds containing nitrogen or nitrides such as GaN, GaAsN, GaAsSbN or the semiconductor compounds containing oxygen such as ZnO, the materials containing oxygen such as the iron oxides and the cuprates (for example, YBaCuO superconductors).

Other materials can also be created such as the silicon hydrides containing hydrogen.

The growth of nitrides is performed in an effective manner using a beam of atoms (N), of excited molecules ($N_2^*$) or NE, $NH_2$ radicals or collectively a mixture of these species. These species will be referred to below as "the reactive species".

In a similar manner, for the growth of oxides use is made of a beam of oxygen atoms (O) and excited molecules ($O_2^*$) or more complex radicals.

These reactive species are produced using cracking sources.

These cracking sources enable communication of the energy to the molecules so as to break the bonds between the atoms or groups of atoms forming the molecules of the initial gas. This energy is thermal, i.e., the gas is introduced into a heated volume. This temperature is on the order of a maximum of 1500° C. for technological reasons.

When the temperatures required for an effective cracking process are higher, use is made of a plasma source in which the temperature of the plasma is much higher (several thousands of degrees centigrade). These plasma sources are of various types: continuous plasma source (DC plasma source), electron cyclotron resonance plasma source (ECR plasma source) or most frequently epitaxy by radio-frequency plasma molecular beams (referred to as RF plasma source). In a general manner, the invention pertains to the growth of thin layers under vacuum requiring the provision of one or more materials generated in the forms of atomic species or excited atomic or molecular species.

By controlling the evaporation cells and the sources, there is created a beam of molecules in the direction of the substrate; it is thereby possible to build complex structures layer by layer in order to create laser diodes, high electron mobility transistors (HEMT) or bipolar transistors. The growth rate is on the order of 1 to several µm per hour.

The depositing under vacuum of semiconductor or superconductor layers requires that the flow of the various materials arriving on the substrate be such that the growth of the thin layer is uniform, i.e., that it exhibits constant properties (thickness, composition, etc.) over the entire surface of the substrate. The surface area of these substrates can range from several $mm^2$ to several thousand $cm^2$.

The invention provides equipment making it possible to adjust the characteristics of the beam during its use. For this purpose, the invention pertains in its broadest sense to epitaxy equipment comprising an epitaxy chamber under vacuum containing a substrate support and at least one cell under vacuum for the evaporation of the epitaxy material closed by a diaphragm having openings and communicating with the epitaxy chamber by a connecting flange, characterized in that it comprises a mobile plate the cross section of which corresponds to the cross section of the diaphragm and which is positioned opposite the diaphragm.

This plate positioned opposite the diaphragm creates rebounds of the reactive species between the exterior surface of the diaphragm, the walls of the plate and the interior environmental surfaces of the epitaxy chamber.

The position (orientation, distance) between the walls of the plate and the exterior surface of the diaphragm makes it possible to adjust the characteristics of the flow of the reactive species, in particular the variation of the relative position of the plate and the exterior surface of the diaphragm makes it possible to greatly vary the amount of reactive species reaching the substrate.

The plate preferably has a cross section corresponding to the cross section of the diaphragm. In a first variant, the plate is mobile in a direction perpendicular to the diaphragm. The course of the plate is advantageously 10 millimeters.

According to a second variant, the plate is angularly mobile to form a dihedron with the plane of the diaphragm.

The plate is preferably made of steel or a dielectric material (for example, quartz or boron nitride).

According to a particular mode of implementation, the plate is actuated by a control rod traversing the wall of the epitaxy chamber via an airtight passage.

According to a first implementation solution, the diaphragm has perforations.

According to a second implementation solution, the diaphragm has an annular opening.

Figure 2:
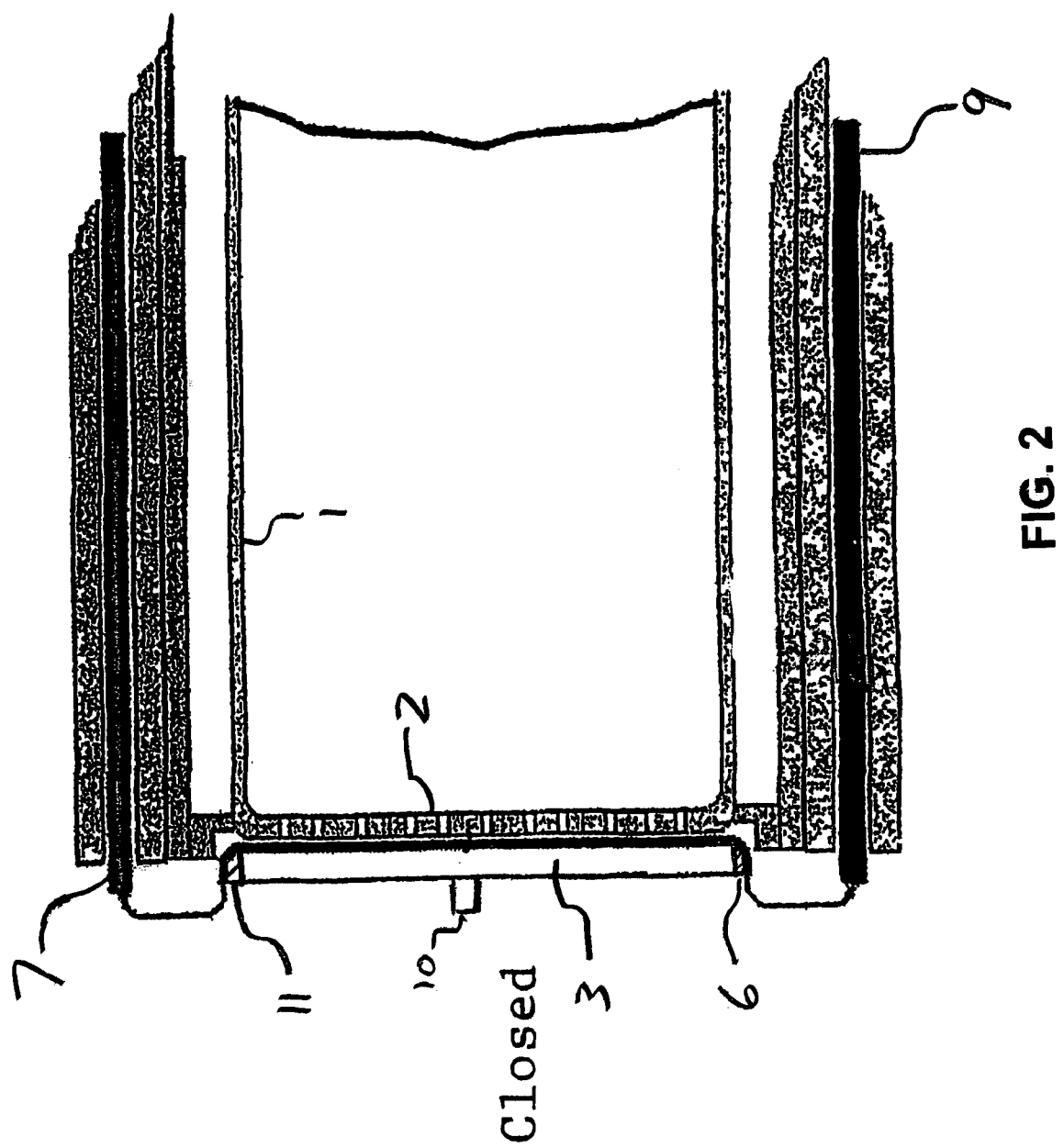
FIG. 2 represents a longitudinal sectional view of the plasma source in the closed position.
Figure 3:
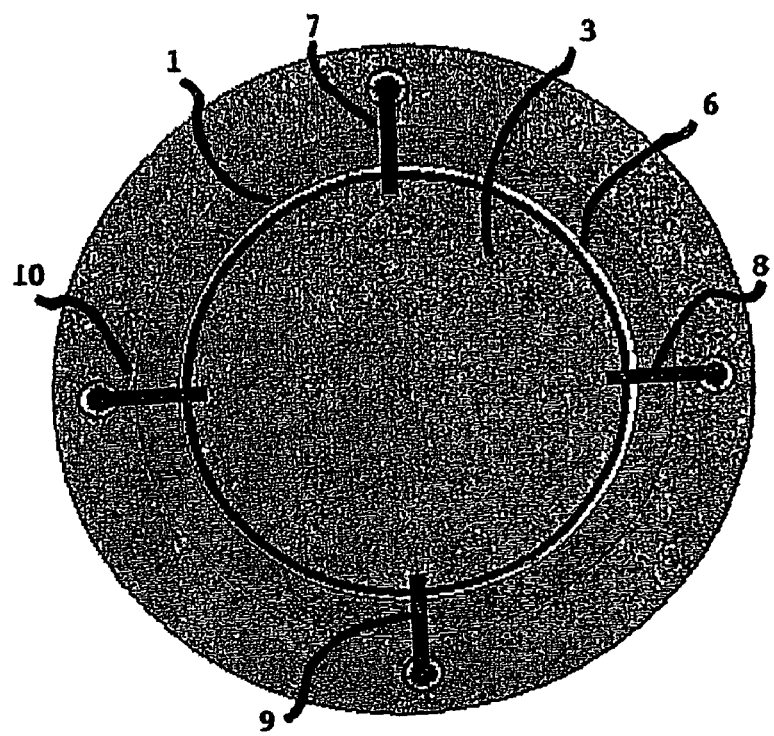
FIG. 3 represents a front view of said plasma source.

Turning to the drawings, FIGS. 1 and 2 represent schematic views of the cavity in open and closed positions, respectively.

The cavity is delimited by a tubular envelope (1) closed downstream by a perforated diaphragm (2). The structure of this cavity is known and not described in further detail. The diaphragm communicates with the epitaxy chamber by a connecting flange (12).

It has a disc-shaped plate (3) positioned parallel to the plane of the diaphragm. It is made of metal and has a cross section of 20 mm, corresponding essentially to the cross section of the source (11).

Figure 4:
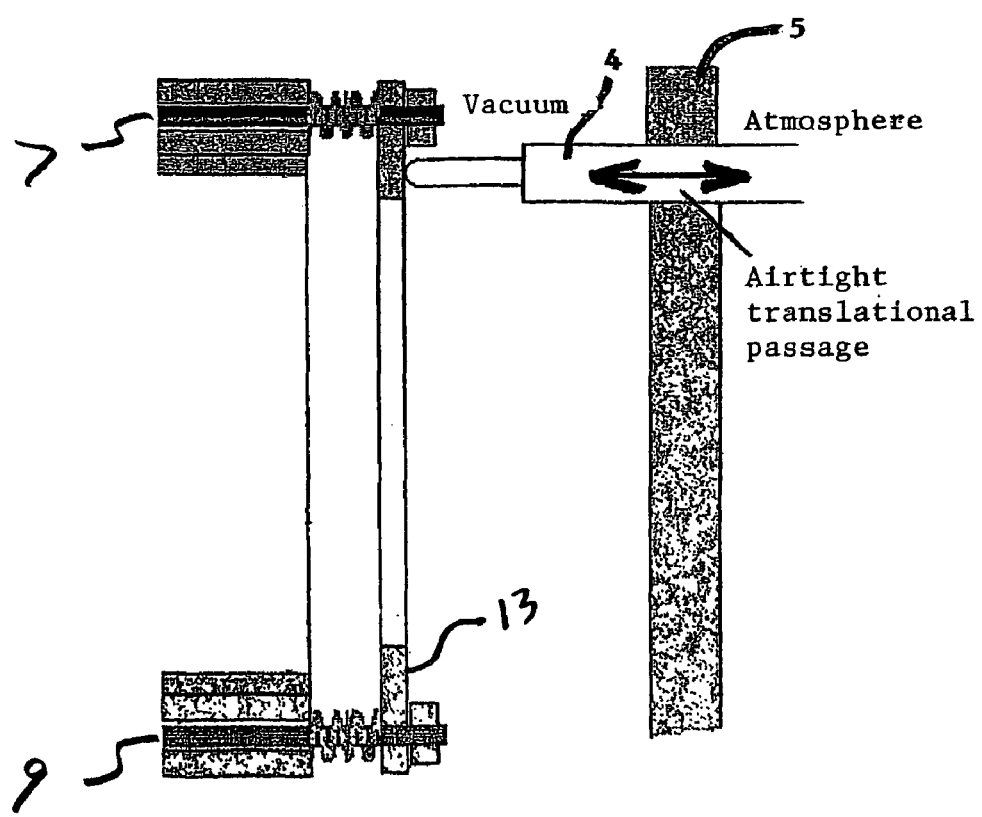
FIG. 4 represents a schematic view of the control device.

This plate can be move between a closed position in which it is pressed against the diaphragm and an opened position in which it is spaced apart from the diaphragm by a maximum distance on the order of 10 mm. The plate is guided by four support rods (7 to 10). The rods and plate are actuated by a mechanism shown in FIG. 4, comprising a control rod (4) traversing the wall of the epitaxy chamber (5). The control rod (4) can be actuated such that it slides through an airtight translational passage in the wall of the epitaxy chamber. The control rod can be moved in the opening direction to contact a spring loaded push ring (13), which causes the support rods to translocate along the translational axis. The opening movement of the control rod and support rods is to the left in FIG. 4, causing the plate 3 to move to the left in order to assume the position shown in FIG. 1. When the control rod is permitted to actuate in the closing direction, the spring loaded push ring is biased to the right, drawing the support rods and plate 3 into the position shown in FIG. 2.

The molecular beam is formed at the level of an annular zone (6) surrounding the plate (3).

Figure 5:
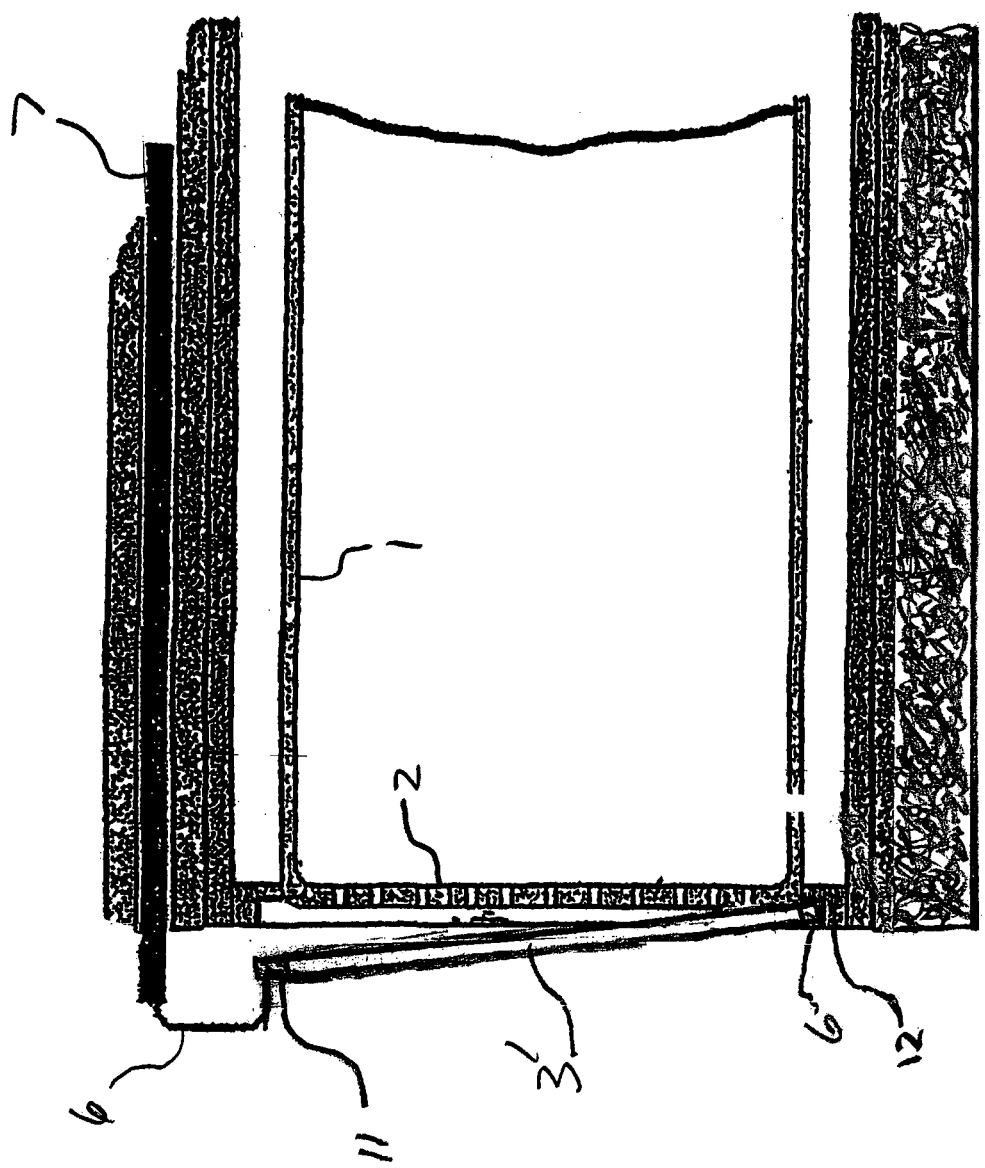
FIG. 5 shows an embodiment of the invention in which the plate is angularly mobile so as to form a dihedron with the plane of the diaphragm.

The second variant of the invention is shown in FIG. 5. In this embodiment, the plate 3' is angularly mobile to form a dihedron with the plane of the diaphragm. The angular mobility may be provided by any pivotal connection, which are known to those skilled in the art, between the plate 3' and a structure in the plane of the diaphragm, such as the connecting flange 12. In the second embodiment, the distance of the center of the plate 3' from the exterior surface of the diaphragm 2 is variable as the plate moves angularly with respect to the diaphragm.

The effects of the invention on the composition of the GaAsN nitrides are explained by the practical results below.

Figure 6:
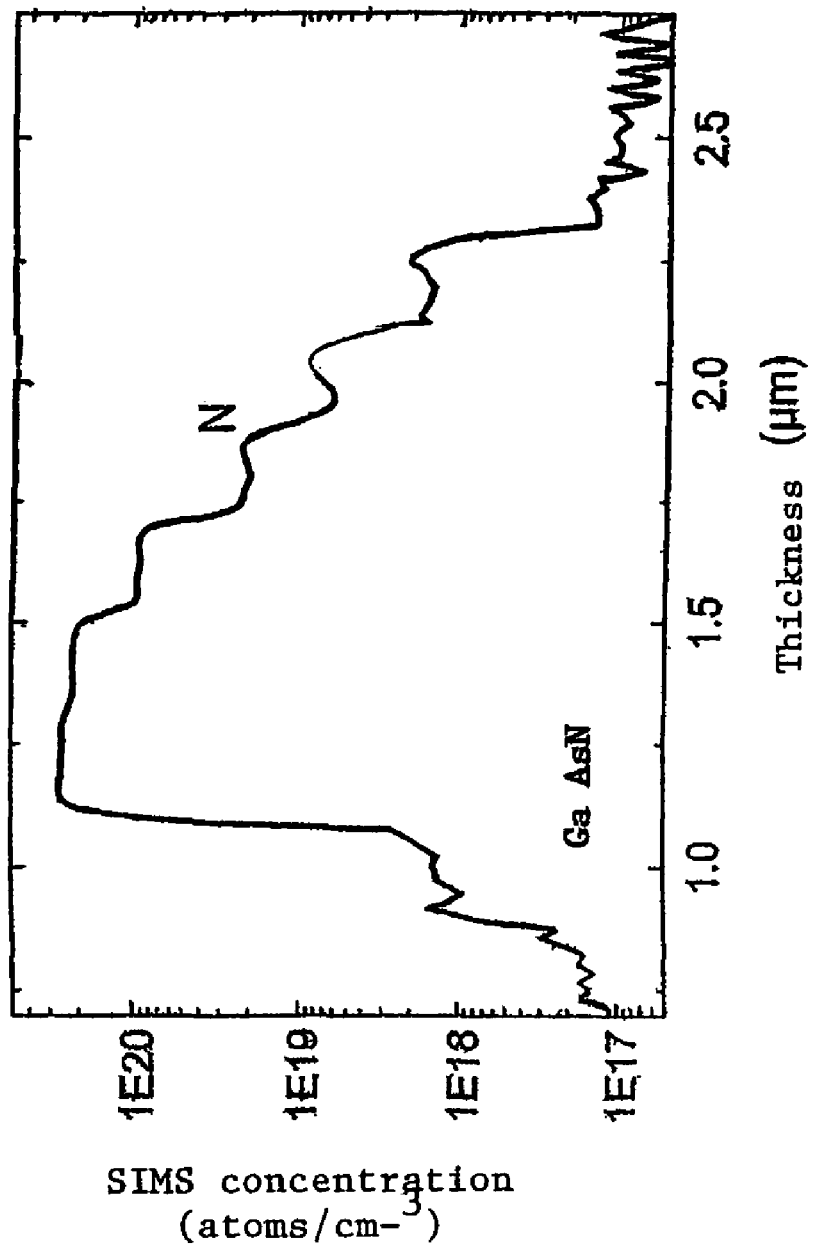
FIGS. 6 and 7 represent the concentration curves of nitrogen in the deposit in relation to the position of the plate.

The curve in FIG. 6 shows the concentration of nitrogen measured by the conventional technique in the field of secondary ion spectrometry (SIMS) in a layer of material $GaAs_xN_{1-x}$ implemented by epitaxy in which x is the concentration of arsenic and 1-x is the concentration of nitrogen.

The layer was applied using two effusion cells, one for generating the gallium beam and the other for the arsenic beam.

The nitrogen beam is produced by an RF plasma source equipped in accordance with the present invention. The plate is positioned at different distances from the diaphragm during the growth of the layer. The curve shows a series of plateaus each of which corresponds to each position of the plate. The height of the plateau provides the concentration of nitrogen measured by the SIMS technique in atoms per $cm^3$. The length of the plateau in μm units indicated on the abscissa shows the time during which the plateau is left in the same position. It can be seen that the regulation dynamic between the extreme positions is very high because the measurement for the closest position of the plate used in this experiment was $2 \cdot 10^{*17}$ atoms per $cm^3$ and close to $2.8 \cdot 10^{*20}$ atoms per $cm^3$ in the most open position used in this experiment.

Figure 7:
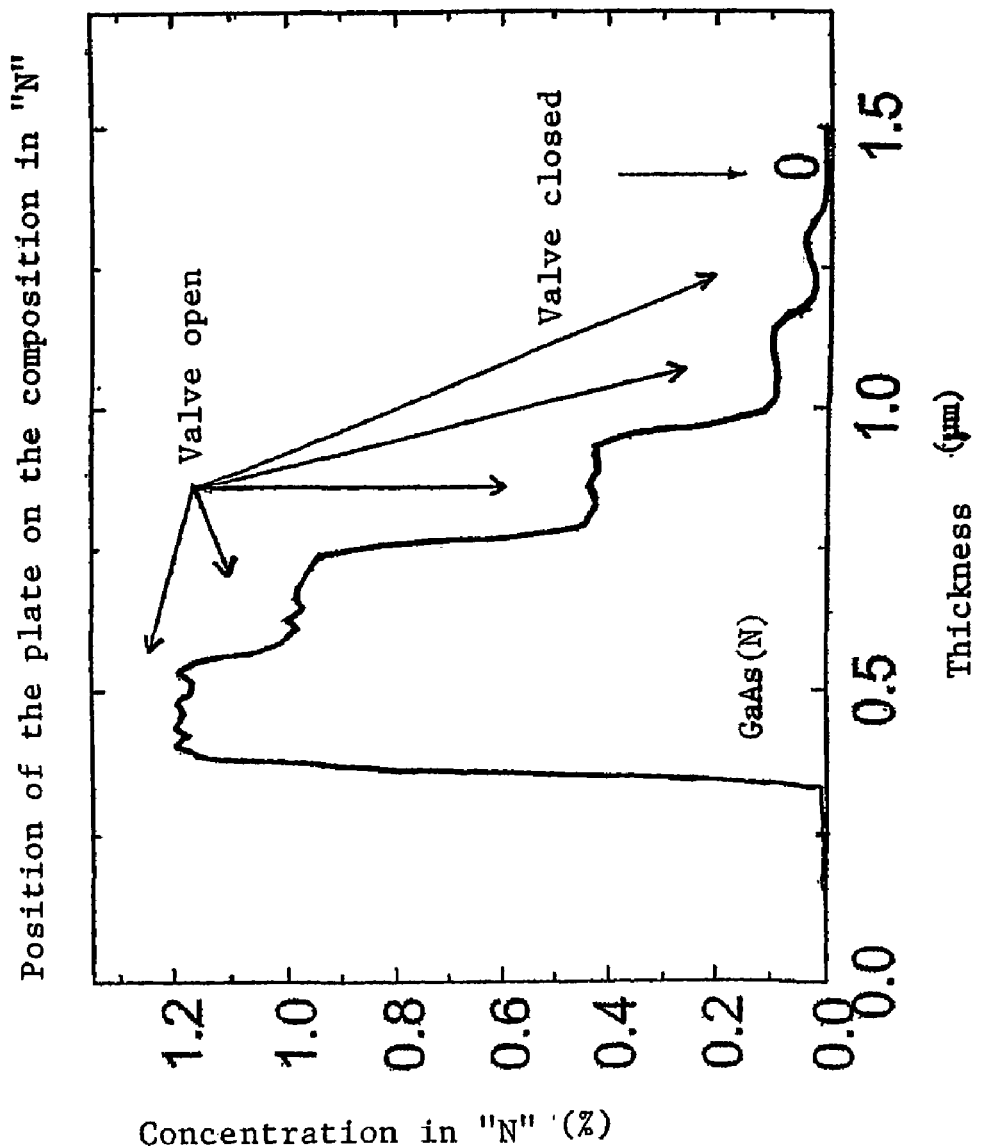

FIG. 7 is a similar curve created using the same SIMS technique on a similar layer of $GaAs_xN_{1-x}$. However, in this case the concentrations in atoms per $cm^3$ were converted into % of the single element in the complete alloy. This curve shows that for this particular layer it was possible to vary the concentration of nitrogen in the layer between an essentially negligible value and a value equal to 1.2%. These values are on the orders of magnitudes of values commonly demanded by users.

The invention also enables creation of a diffusion of reactive species markedly improving the homogeneity of the deposit at the level of the substrate(s).

Figure 8:
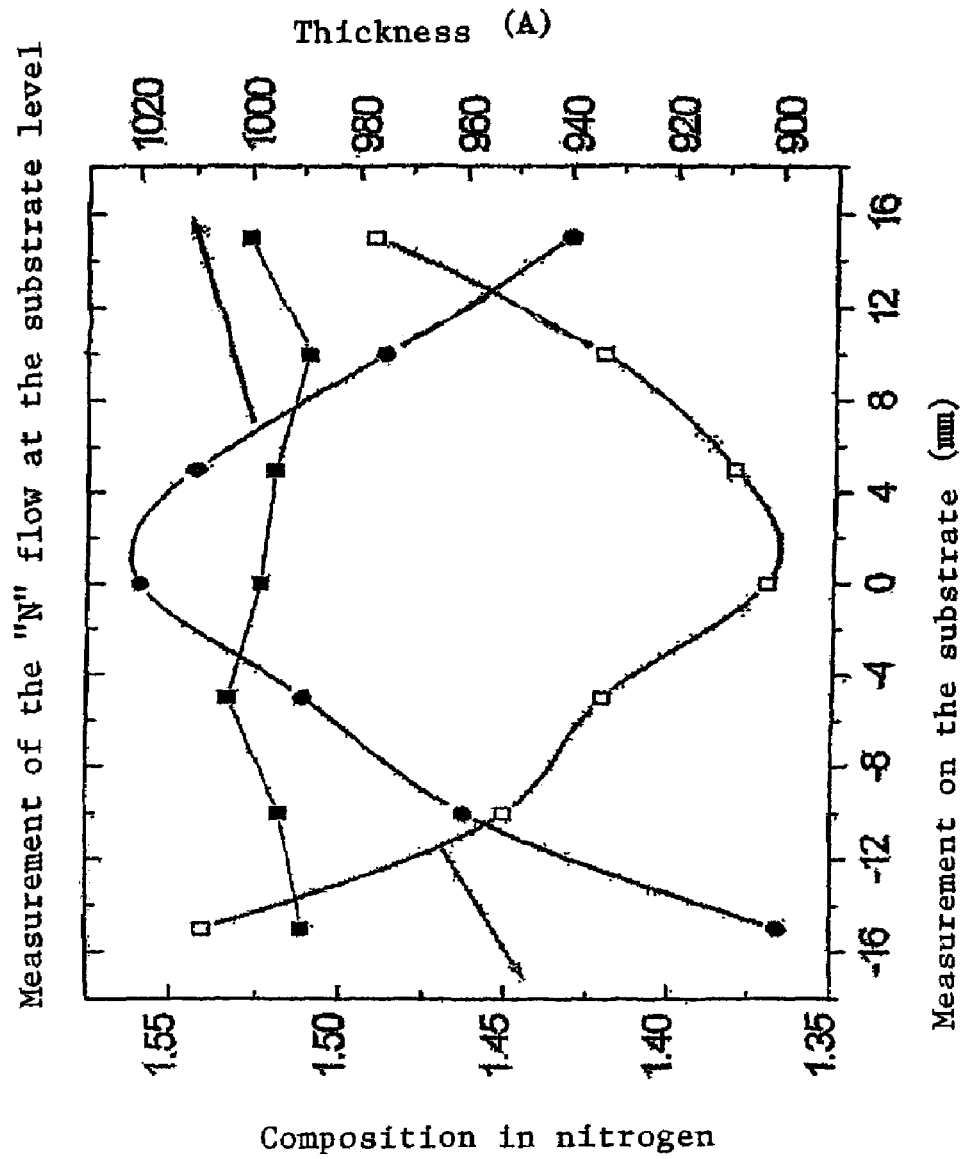
FIG. 8 is the curve representing the effect of the position of the plate on the deposits implemented on the substrate.

The following experiment was carried out to demonstrate this effect:

The curves of FIG. 8 show the composition in nitrogen in % (scale at left) and the thickness of the layer in angstrom (scale at right). The abscissa is the distance in which the measurement is made in relation to the center of the substrate (wafer) in mm.

The measurement is performed by X-ray diffraction, a technique which can measure the thickness of a thin layer and the concentration of the various elements that compose it at various points on the surface of the substrate.

It can be seen that the course of the variation of thickness is essentially the inverse of that of the thickness. It is seen that the concentration of nitrogen is low where the thickness is high (center of the zero position layer) and high where the thickness is lowest.

The incident flow of the reactive nitrogen species is the product of the concentration times the thickness, this product being made and represented by the top curve (squared). The curve represents the value V of the flow of the reactive nitrogen species reaching the surface of the substrate.

The calculation from the values V raised on the curve shows a uniformity lower than 1.7%.

Uniformity is defined here as (Vmax−Vmin) divided by the mean value of V equal to (Vmax+Vmin) divided by two.

The invention claimed is:

1. Epitaxy equipment comprising:
   an epitaxy chamber under vacuum containing a substrate support and at least one cell under vacuum for evaporation of epitaxy material closed by a diaphragm having at least one opening and communicating with the epitaxy chamber by a connecting flange, and a mobile plate positioned opposite the diaphragm such that the distance of the plate from an exterior surface of the diaphragm is variable and has a cross section corresponding to a cross section of the diaphragm and a molecular beam is formed at a level of a zone surrounding the plate.

2. The epitaxy equipment according to claim 1, wherein the plate is disc-shaped.

3. The epitaxy equipment according to claim 2, wherein the distance is 10 millimeters.

4. The epitaxy equipment according to claim 1, wherein the plate is mobile in a direction perpendicular to the diaphragm.

5. The epitaxy equipment according to claim 1, wherein the plate is made of metal or a dielectric material.

6. The epitaxy equipment according to claim 1, wherein the plate is actuated by a control rod traversing a wall of the epitaxy chamber via an airtight passage.

7. The epitaxy equipment according to claim 1, wherein the diaphragm has perforations.

8. The epitaxy equipment according to claim 1, wherein the diaphragm has an annular opening.

9. Epitaxy equipment comprising:

an epitaxy chamber under vacuum containing a substrate support and at least one cell under vacuum for evaporation of epitaxy material closed by a diaphragm having at least one opening and communicating with the epitaxy chamber by a connecting flange, an angularly mobile plate positioned opposite the diaphragm such that the plate forms a dihedron variable with a plane of the diaphragm, the distance of a center of the plate from an exterior surface of the diaphragm being variable, the plate having a cross section corresponding to a cross section of the diaphragm, and a molecular beam being formed at a level of a zone surrounding the plate.

* * * * *